United States Patent
Shrader et al.

(10) Patent No.: US 7,955,783 B2
(45) Date of Patent: Jun. 7, 2011

(54) LAMINATION FOR PRINTED PHOTOMASK

(75) Inventors: Eric Shrader, Belmont, CA (US); Uma Srinivasan, Mountain View, CA (US); Clark Crawford, Danville, CA (US); Scott Limb, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 804 days.

(21) Appl. No.: 11/938,195

(22) Filed: Nov. 9, 2007
(Under 37 CFR 1.47)

(65) Prior Publication Data

US 2009/0123873 A1     May 14, 2009

(51) Int. Cl.
    *G03F 7/00*       (2006.01)
    *G03F 7/16*       (2006.01)
    *G03F 7/26*       (2006.01)
    *G03F 7/40*       (2006.01)

(52) U.S. Cl. ...... 430/311; 430/5; 430/270.1; 430/273.1; 430/319; 430/322; 430/330; 430/331

(58) Field of Classification Search ............... 430/311, 430/273.1, 5, 270.1, 330, 331, 322, 319
See application file for complete search history.

(56) References Cited

U.S. PATENT DOCUMENTS

| | | | | |
|---|---|---|---|---|
| 5,691,395 | A  * | 11/1997 | Knudsen et al. | 522/31 |
| 6,462,107 | B1 * | 10/2002 | Sinclair et al. | 523/456 |
| 6,515,186 | B2 * | 2/2003 | Kane et al. | 568/443 |
| 6,625,032 | B1 * | 9/2003 | Ito et al. | 361/751 |
| 6,742,884 | B2 * | 6/2004 | Wong et al. | 347/99 |
| 6,872,320 | B2 * | 3/2005 | Wong et al. | 216/13 |
| 6,890,050 | B2 | 5/2005 | Ready et al. | |
| 6,972,261 | B2 | 12/2005 | Wong et al. | |
| 7,309,563 | B2 * | 12/2007 | Paul et al. | 430/322 |
| 7,374,977 | B2 * | 5/2008 | Yamazaki et al. | 438/149 |
| 7,498,119 | B2 * | 3/2009 | Limb et al. | 430/311 |
| 7,514,637 | B1 * | 4/2009 | En | 174/256 |
| 7,714,069 | B2 * | 5/2010 | Corcoran et al. | 525/123 |
| 2005/0136358 | A1 | 6/2005 | Paul et al. | |
| 2006/0105492 | A1 * | 5/2006 | Veres et al. | 438/99 |

FOREIGN PATENT DOCUMENTS

EP      568841 A1 * 11/1993

* cited by examiner

*Primary Examiner* — Amanda C. Walke
(74) *Attorney, Agent, or Firm* — Jonathan A. Small

(57) ABSTRACT

A method for masking regions of photoresist in the manufacture of a soldermask for printed circuit boards is disclosed. Following application of photoresist over patterned traces on a substrate, a sheet-like thin film is applied over the photosensitive material. The thin film may adhere to the photosensitive material by way of the adhesive state of the photosensitive material or by way of an adhesive applied to the photosensitive material or the thin film or carried by the thin film. Digital mask printing may proceed on the surface of the thin film. The photosensitive material may then be exposed through the printed photomask, the thin film (with photomask) removed, and the photosensitive material developed.

6 Claims, 7 Drawing Sheets

FIG. 1
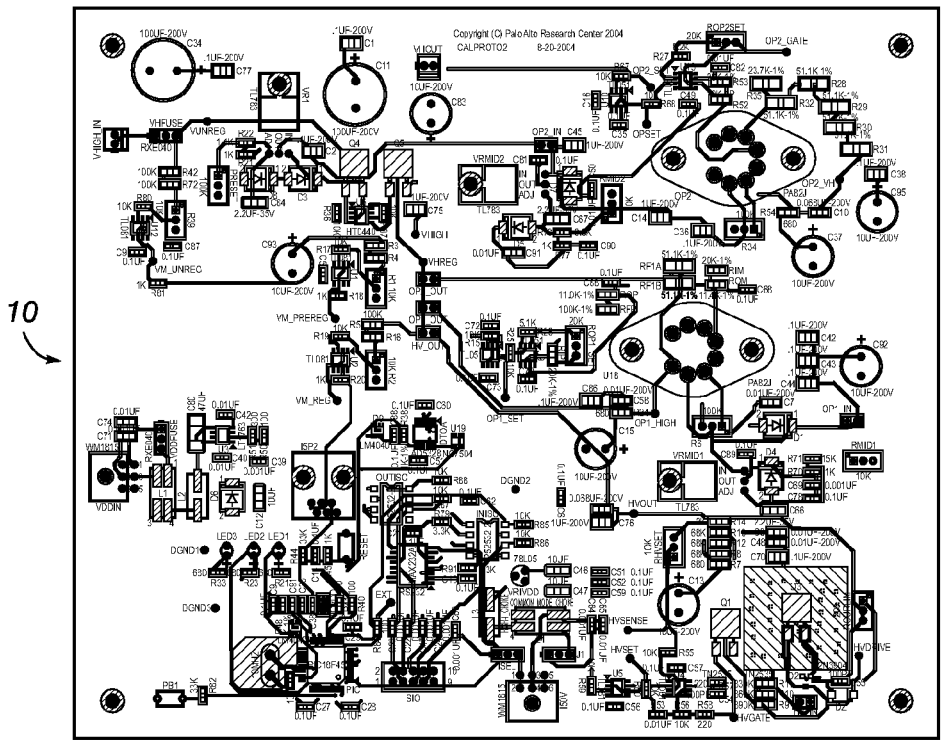
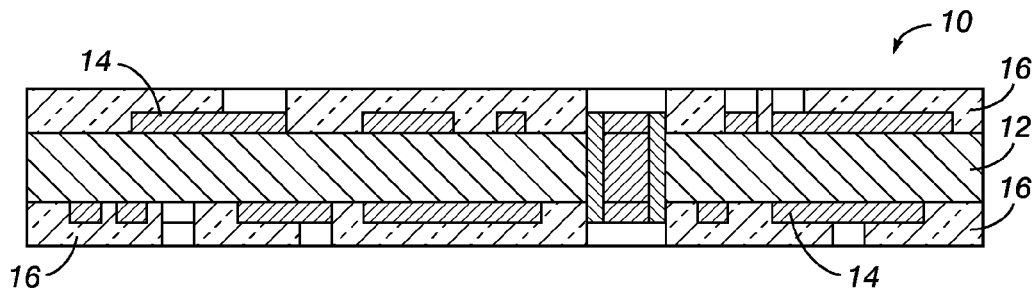
FIG. 2

LAMINATION FOR PRINTED PHOTOMASK

BACKGROUND OF THE INVENTION

1. Field of the Invention

The present invention is related to the manufacture of printed circuit boards, and more particularly to a method of masking regions of a plated substrate during a pre-development expose phase of manufacturing.

2. Description of the Prior Art

A printed circuit board ("PCB") is a rigid or semi-flexible structure designed to have electrical or electromechanical components attached thereto. PCBs may be found in virtually all of the electronic devices with which we come into contact today. The PCB itself typically consists of a non-conductive substrate having a number of patterned conductive interconnections, or traces, formed on one of both sides thereof. The traces permit electrical interconnection of the components attached to the PCB. Typically, both sides of the non-conductive substrate are first plated in copper. The copper is selectively removed, remaining only where electrical interconnection is desired. An insulative material, referred to as a solder mask, is then applied over the patterned copper. Regions of the solder mask are selectively removed where electrical connection to the components is to be made. Regions of solder mask which remain are hardened and form a portion of the finished PCB, electrically isolation copper interconnections thereunder. There are two common techniques for this selective removal of the solder mask.

A first technique is silk-screen printing of an etch resistant material directly over the blanket solder mask layer. The screen is effectively a negative of the final desired pattern of exposed copper. Once deposited, the structure is placed in an etch bath which removes unwanted solder mask material, leaving the desired copper contact points. A variation of this technique is to silk-screen an insulative layer directly onto the substrate and patterned copper.

In a second technique, a photosensitive material (typically a negative, but may be a positive photo sensitive material) is applied to the substrate and patterned copper. A pattern is then optically exposed on the material, either through a photomask or by a position-controlled laser. The light is typically UV. The present invention is particularly relevant to in the masked photo sensitive material process.

In the case of a negative photo sensitive material, the portion of the material that is exposed to UV light becomes cross-linked and relatively insoluble to the developer. The unexposed portion of the material is dissolved by the developer, and those portions of the material exposed to light are etched away, leaving the un-exposed material in place. The remaining material may then be hardened, typically by heating forming the solder mask.

In the case of a positive photo sensitive material, the portion of the material that is exposed to UV light becomes soluble to the developer and the portion of the material that is unexposed remains insoluble to the developer. The exposure, development, and hardening steps are otherwise the same.

The photo sensitive solder mask technique described above has been refined such that it now typically can produce parts with very few defects (i.e., provides very high yield). However, there remains pressure on manufacturers to reduce cost of manufacturing. One significant expense in the manufacturing process is the mask manufacturing. Another is the application of the mask, which requires careful alignment of the mask with reference to landmarks on the substrate. This alignment requires manufacturers to use expensive alignment tools and fixtures during device manufacturing and adds to the production time for such parts.

In order to address the need to reduce the cost of the manufacturing process, print-like processes have been developed for photomasking. For example U.S. Pat. Nos. 6,872,320 and 6,742,884 (each incorporated herein by reference) teach a system and process, respectively, for direct marking of a phase change material onto a substrate in order to produce a photomask. According to these references, a suitable material, such as a stearyl erucamide wax, is maintained in liquid phase over an ink-jet style piezoelectric printhead, and selectively ejected on a droplet-by-droplet basis such that droplets of the wax are deposited in desired locations in a desired pattern on a layer formed over a substrate. The droplets exit the printhead in liquid form, then solidify after impacting the layer, hence the material is referred to as phase-change. We refer to a mask used in the photoresist process described above as a "printed photomask," and the process used to form the printed photomask as "digital mask printing."

There are many instances in PCB design where it is necessary to make through-connection from one surface of the PCB to the other. For instance, to reduce the overall size of the PCB, and hence reduce the overall size of the device into which it is installed, both sides of the PCB may contain circuit components. Some of the components on one side of the PCB must be electrically connected to components on the opposite side of the PCB. To do so, an opening is created in the substrate, typically by simply drilling a hole in the desired location. In order to produce an adequate solder connection through the holes, the copper conductive material is allowed to plate the sidewalls of the holes as well as the planar surfaces of the substrate.

Typically, the photo sensitive solder mask material is uniformly spread over the patterned copper and non-conductive substrate. This means that the material ends up not only on the surface of the substrate, but also on the sidewalls of the holes in the substrate made for through-contacts. As mentioned, it is desired that the sidewalls of these holes be conductive, i.e., have copper applied thereto. Therefore, any silk screening or masking for photoresist exposure must be accurately aligned to the holes to prevent expose and hence cross-linking of the resist material.

The problem arises in forming a printed photomask for PCBs having though-holes that the direction of ejection of droplets of phase-change material from the print head is parallel to the sidewall surface. That is, the direction in which the droplets are deposited is such that they do not come to rest on the sidewalls. As it is desired to mask the sidewalls of the through-holes from exposure, the standard printed photomask process is not effective for production of PCBs of this type.

Accordingly, there is a need in the art for a method of forming a printed photomask capable of masking the copper-coated sidewalls of through-holes of a substrate in the process of manufacturing a PCB. The process should be compatible with existing PCB manufacturing processes and equipment so as not to add to the cost and time of production of the final PCB product.

SUMMARY OF THE INVENTION

Accordingly, the present invention is directed to methods for forming a printed circuit board which masks regions around through holes such that the sidewalls of the through-holes are not exposed to UV light prior to development of photo-sensitive solder mask material. In a photo-sensitive material-based process, a printed photomask is provided capable of masking the copper-coated sidewalls of through-holes of a substrate in the process of manufacturing a PCB. The process is compatible with existing PCB manufacturing processes and equipment so as not to add to the cost and time of production of the final PCB product.

According to one aspect of the invention, following the application of a photo-sensitive solder mask material, a thin sheet-like film is applied over the solder mask material. Typically, ultraviolet (UV) light is used in the photo-etch process, and UV-based photo-sensitive materials are well known. Accordingly, the thin film should be transparent to UV wavelengths. It should also be sufficiently thick to permit handling, but sufficiently thin to prevent under-mask scattering of UV light.

According to another aspect of the present invention, the photoresist solder mask material is partially cured. The curing process stops prior to the tack-cure stage, presenting a tacky surface to which the thin film adheres. According to still another aspect of the present invention, the photoresist solder mask may be fully tack-cured. A solvent is applied to the surface of a tack-cured photoresist solder mask to soften it sufficiently to present an adhesive surface to which the thin film may be applied. A still further aspect of the present invention employs a thin film having an adhesive back which may be applied directly to a tack-cured photoresist solder mask.

A series of opaque material droplets are then applied to the surface of the thin film in essentially a printing process. A printhead of a type usable as an ink jet printer may be employed to deposit the droplets. In one embodiment, the droplets are of a phase change material such that they are essentially in liquid phase as ejected, and solidify on the thin film. The pattern of the droplets forms a photomask on the thin film, as opposed to directly on the photoresist solder mask. As the droplets are used to block exposure of the underlying photo-sensitive solder mask to UV light, the droplet material is opaque to UV light.

Exposure of the entire surface (both surfaces in some embodiments) to UV light causes regions not blocked by the photomask to be exposed, cross-linking the exposed photoresist solder mask material. The thin film having the printed photomask thereon may then be physically removed by simply peeling the film off of the structure. Accordingly, the level of adhesion of the film to the substrate is chosen such that the film does not peel away during processing but such that it is removable without undue force and without damaging the underlying PCB structure.

The structure may then be developed so that unexposed photoresist is removed. What remains is a structure covered in solder mask material except in selected regions such as where electrical connection to components is required. Subsequent hardening of the remaining solder mask material and application of an anti-oxidation coating over any exposed copper completes the process.

Accordingly, the present invention may be embodied in a method for forming a pattern of electrical contact regions over a non-conductive substrate on which electrical interconnections have previously been formed, comprising the steps: forming a layer of photosensitive material over the electrical interconnections and the non-conductive substrate; depositing a film over the photosensitive material, said film transparent in a first wavelength band; depositing droplets of phase change material in a pattern on said film so as to form a photomask thereon; exposing said photosensitive material to light in said first wavelength band in regions other than directly below the photomask pattern of phase change droplets; removing said film and said photomask pattern of phase change droplets; and developing said photosensitive material so as to remove regions of said photosensitive material not exposed to said electrical interconnections and the nonconductive substrate, thereby exposing regions of said electrical interconnections and said non-conductive substrate.

The above is a summary of a number of the unique aspects, features, and advantages of the present invention. However, this summary is not exhaustive. Thus, these and other aspects, features, and advantages of the present invention will become more apparent from the following detailed description and the appended drawings, when considered in light of the claims provided herein.

BRIEF DESCRIPTION OF THE DRAWINGS

In the drawings appended hereto like reference numerals denote like elements between the various drawings. While illustrative, the drawings are not drawn to scale. In the drawings:

FIG. 1 is a photograph of a printed circuit board (PCB) of a type which may be manufactured according to the present invention.

FIG. 2 is a cross-section of a dual sided PCB illustrating a number of traces, a through-hole, and photoresist.

DETAILED DESCRIPTION OF THE INVENTION

Figure 3:
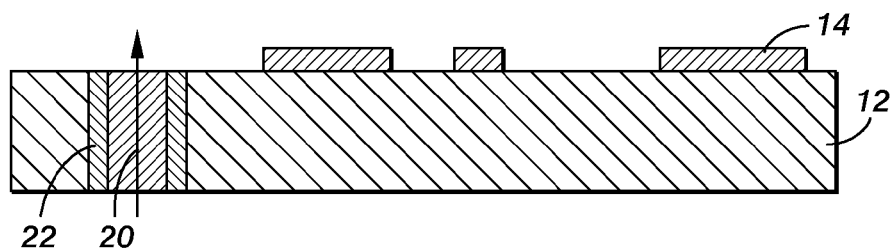
FIG. 3 is a first step in the process of forming a PCB according to an embodiment of the present invention.

Described in the following section are specific steps for the formation of a printed photomask, and the production of structures formed with said mask. The printed photomask is formed on a thin film carrier, temporarily applied to the structure being masked. An improved process for the formation of printed circuit boards is thereby enabled.

With reference to FIGS. 1 and 2, there is shown therein an example of a printed circuit board 10 of a type which may be manufactured according to the present invention. Printed circuit board (or PCB) 10 consists of a substrate 12 such as a woven/laminated fiberglass material. The substrate is rigid and can be drilled, cut or machined. Applied to the substrate is a patterned network of conductive electrical interconnections, for example traces 14. While beyond the scope of this disclosure, traces 14 are typically photolithographically patterned copper applied to the surface of substrate 12 as well understood in the art.

Applied over the surface of substrate 12 and traces 14 is an insulative photoresist 16. Photoresist 16 is typically applied is a liquid form, and comprises a hardenable photosensitive material. Such materials are well know in the art an example material is liquid photo-imageable solder mask PSR-4000-HFX manufactured by Taiyo. Selected regions of the photoresist 16 are exposed to light, typically in the ultra violet (UV) range of the spectrum, causing the exposed regions cross-link and thereby rendering those regions less soluble to selected solvents than corresponding unexposed regions. The unexposed regions may thus be selectively removed by a development process well understood in the art. A solder mask is thereby produced in situ over traces 14. The openings in the solder mask may then be used to make electrical contact to the underlying traces 14, typically by way the application of solder (not shown) therein. It should be noted that the PCB 10 shown in FIG. 2 has traces 14 and solder mask 16 on both primary plane faces, as is common today.

The following description, with reference next to FIGS. 3 through 12, illustrates the process for forming a mask for the purpose of patterning the photoresist 16 and forming the solder mask. For simplicity, only a single planar face is illustrated as having traces 14 and solder mask 16, although a dual sided structure is within the scope of the present invention. Furthermore, only a single layered structure is illustrated and discussed in detail. However, the present invention has equal applicability in the formation of multi-level PCBs as will readily be understood by one skilled in the art.

An exemplary process according to the present invention begins with a substrate 12 having formed thereon a pattern of traces 14, as illustrated in FIG. 3. Substrate 12 will also have number of through holes, such as through hole 20, formed therein. It should be noted that the material forming traces 14, typically copper, will also have been deposited on the sidewalls 22 of through hole 20.

Figure 4:
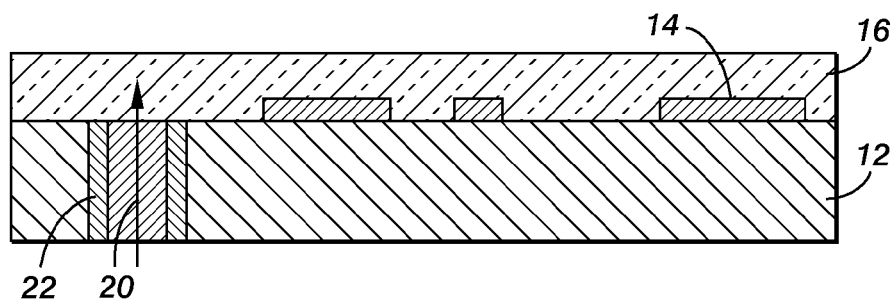
FIG. 4 is a second step in the process of forming a PCB according to an embodiment of the present invention.

With reference next to FIG. 4, photo-sensitive material 16 is applied over the entire primary planar surface of substrate 12 and traces 14. This material is typically applied as a curtain coating, although the specific techniques of application are not germane to the present invention. While the specific formulation of the photo-sensitive material 16 is also not germane to the limitations of the present invention, an example of such a photo-sensitive material is the aforementioned liquid photo-imageable solder mask PSR-4000-HFX manufactured by Taiyo.

According to one embodiment of the present invention, the photoresist material 16 is then partly cured, typically by heating in an oven. According to known process, the photoresist material 16 would be cured to what is referred to as a tack-cured stage. That is, it is cured to a point where its surface is minimally adhesive, so that the structure may be handled without damaging the photoresist material. However, according to this embodiment of the present invention, the photoresist material 16 is cured to a point prior to the tack-cured stage, so that its surface is somewhat tacky or adhesive, accomplished either by less time exposed to heat, lower heat, or both.

With reference next to FIGS. 5 through 8, a thin sheet-like film 24 is applied over the photoresist 16. Many different materials may function as the thin film. Polyethylene terephthalate (PET), for example, Mylar, from E.I. du Pont de Nemours and Company and polyvinyl fluoride (PVF), for example, Tedlar, from E.I. du Pont de Nemours and Company are two examples. Film thickness is selected so that the film may be handled without tearing, but no so think as to cause under-pattern scattering during exposure. A thickness in the range of 6-50 micrometers (μm) is preferred. Thin film material 24 may be applied by an apparatus of the type illustrated in FIG. 5, in which the thin film material is applied to the surface of photoresist 16 by the application of pressure from pinch rollers 26, or other similar arrangement.

According to this embodiment, thin film 24 adheres to the structure due to the tackiness or adhesiveness of the surface of photoresist material 16 to which it is applied. In a subsequent step, thin film 24 will be manually removed. Therefore, the degree of adhesion is important. On the one hand, if thin film 24 it too strongly adhered to the surface of photoresist material 16, removal of the film may be difficult, and the removal process may damage photoresist material 16. On the other hand, if thin film 24 is too weakly adhered to the surface of photoresist material 16, subsequent processing and handling steps may disrupt the alignment of mask material (described below) formed on thin film material 16 with traces 14 and through hole 20.

Figure 5:
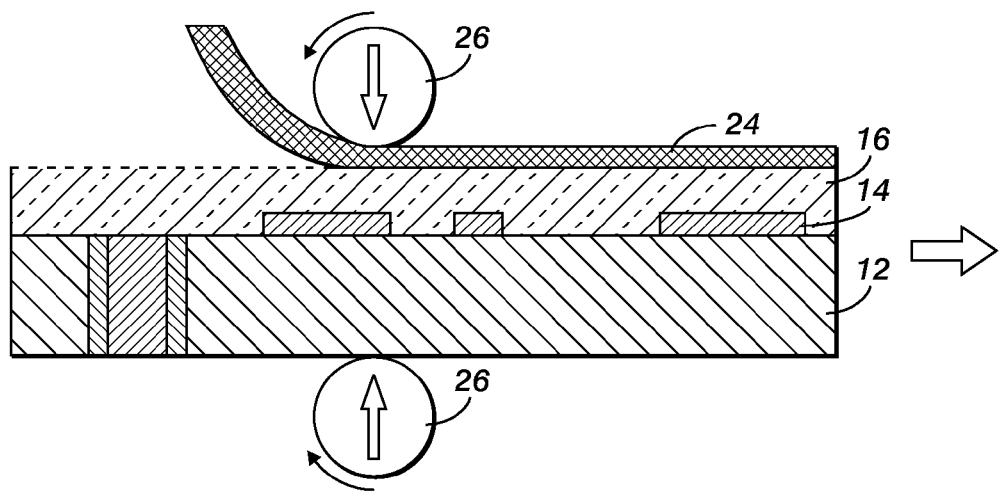
FIG. 5 is an illustration of applying a sheet-like thin film in the process of forming a PCB according to a first embodiment of the present invention.
Figure 6:
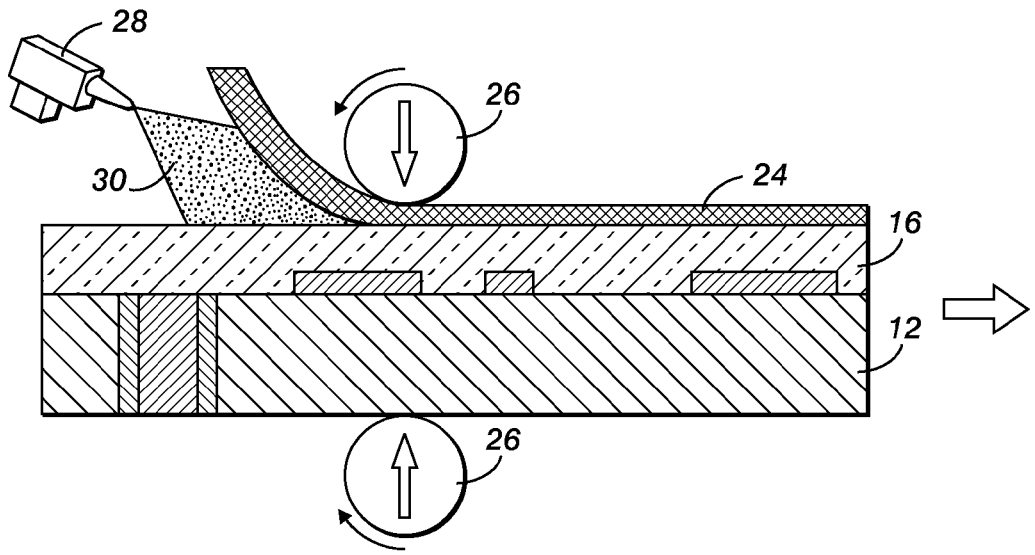
FIG. 6 is an illustration of applying a sheet-like thin film in the process of forming a PCB according to a second embodiment of the present invention.

According to the embodiment illustrated in FIG. 5, the adhesion between thin film 24 and photosensitive material 16 is a result of tackiness of the film due to partial curing. According to another embodiment of the present invention illustrated in FIG. 6, photoresist material 16 may be fully tack cured, and just prior to application of thin film 24 thereover, the surface of either photoresist material 16 or thin film 24 or both are sprayed with a solvent 30, such as isopropyl alcohol, applied by an appropriate spray apparatus 28, to create a tacky surface and adhesion by surface tension to which thin film 24 may adhere. In place of solvent 30, an adhesive (not shown) may be sprayed on or similarly applied to either photoresist material 16 or thin film 24 or both to provide the desired adhesion between photoresist material 16 and thin film 24.

Figure 7:
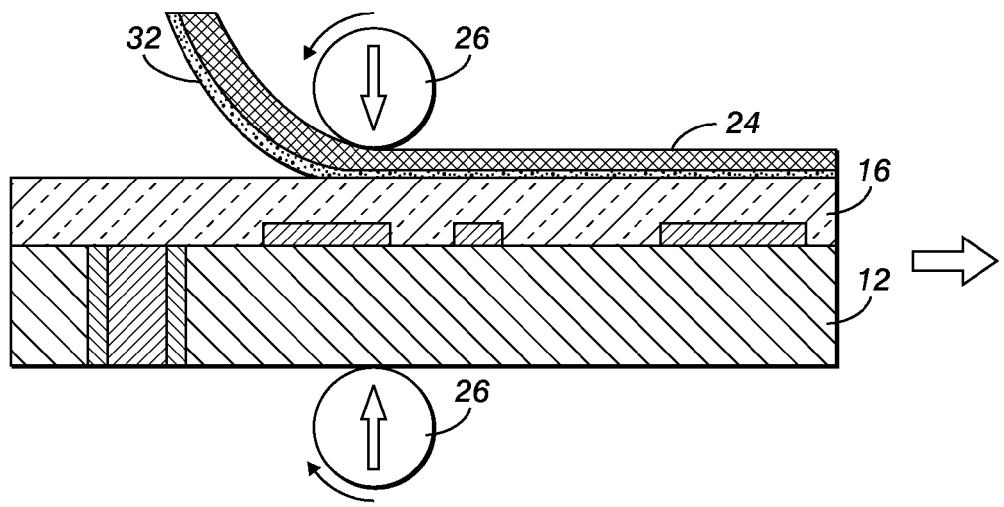
FIG. 7 is an illustration of applying a sheet-like thin film in the process of forming a PCB according to a third embodiment of the present invention.

According to yet another embodiment of the present invention illustrated in FIG. 7, the photoresist material 16 may be fully tack cured, and thin film 24 has a pre-applied layer of adhesive 32 which adheres to the surface of the photosensitive material. Indeed, there are other methods which may be employed to adhere thin film 24 to the surface of photoresist material 16, and the choice of methods should not be read as a limitation on the broader ideas of the present invention disclosed and claimed herein.

Figure 8:
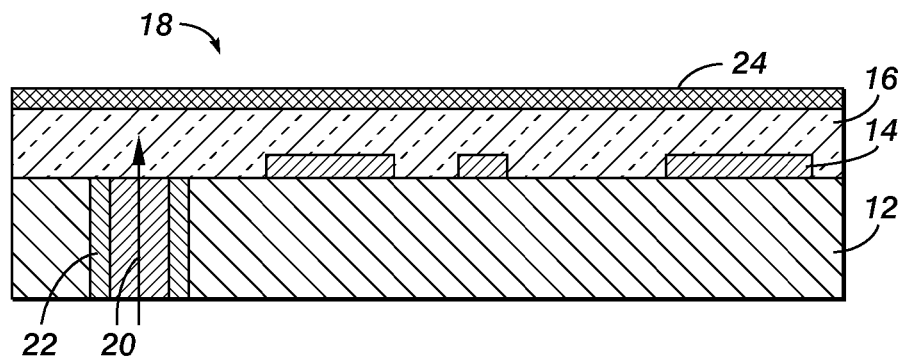
FIG. 8 is a further step in the process of forming a PCB according to an embodiment of the present invention, illustrating a PCB structure with thin film.

According to each of these embodiments, a structure 18 is ultimately produced, which appears as illustrated in FIG. 8, with thin film 24 adherently disposed over photoresist material 16.

Figure 9:
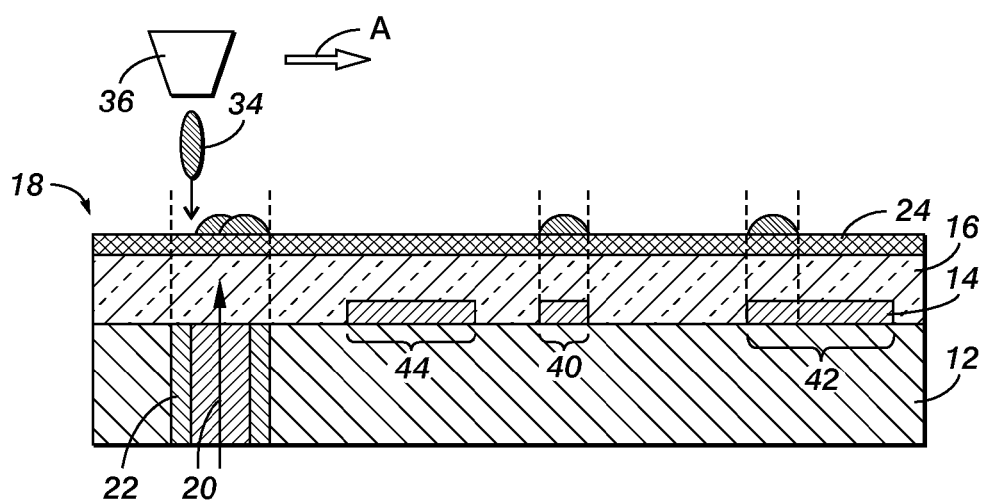
FIG. 9 is a still further step in the process of forming a PCB according to an embodiment of the present invention, illustrating the deposition of a digitally printed mask.

The next stage in the process according to an embodiment of the present invention is to form a printed photomask on the surface of thin film 24. This is illustrated in FIG. 9. According to a preferred embodiment of the present invention, a printed photomask is formed by digital mask printing, a process well known in the art. In this process, substrate 12 is aligned relative to an ink-jet type printhead 36. A print material 34 is deposited by moving the ink-jet type printhead 36 and the surface of film 24 (i.e., substrate 12) relative to one another, typically along a single axis (the "print travel axis", for example represented by arrow A). Print heads, and in particular, the arrangements of the ejectors incorporated into those print heads, are optimized for printing along this print travel axis. Printing takes place in a raster fashion, with the print head making "printing passes" across the substrate as the ejector(s) in the print head dispense individual "droplets" of print material onto the substrate, forming printed mask features 38. Typically, the print head moves relative to the substrate in each printing pass, but the equivalent result may be obtained if the substrate is caused to move relative to the print head (for example, with the substrate secured to a moving stage) in a printing pass. At the end of each printing pass, the print head (or substrate) makes a perpendicular shift relative to the print travel axis before beginning a new printing pass. Printing passes continue in this manner until the desired pattern has been fully printed onto the substrate.

Materials typically printed by digital mask printing, and digital lithographic systems in general, include phase change material and solutions of polymers, colloidal suspensions, such suspensions of materials with desired electronic properties in a solvent or carrier. See the aforementioned U.S. Pat. Nos. 6,742,884 and 6,872,320. For the present application, a stearyl erucamide wax ejected in liquid phase by an ink-jet style piezoelectric printhead is effective for digital mask production.

Once dispensed from an ejector, the print material droplets attach themselves to the surface of thin film 24 through a wetting action, then proceeds to solidify in place, forming printed mask features 38. In the case of printing phase-change materials, solidification occurs when the heated and liquefied printed droplet loses its thermal energy and reverts to a solid form. In the case of suspensions, after wetting to the substrate, the carrier most often either evaporates leaving the suspended material on the surface of thin film 24, or the carrier hardens or cures. The thermal conditions and physical properties of the print material, thin film layer 24 (along with subordinate layers and substrate), as well as the ambient conditions and nature of the print material, determine the specific rate at which the deposited print material transforms from a liquid to a solid, and hence the height and profile of the solidified printed mask feature 38.

If two adjacent droplets are applied to the surface of thin film 24 within a time prior to the phase-change of either or both droplets, the droplets may wet and coalesce together to form a single, continuous printed feature. Surface tension of the droplet material, temperature of the droplet at ejection, ambient temperature, thin film surface temperature, etc., are key attributes for controlling the extent of droplet coalescence and lateral spreading of the coalesced material on the substrate surface. These attributes may be selected such that a desired feature size may be obtained. Control of the digital mask printing process is well known in the art, and there are many parameters which one skilled in the art may adjust to obtain the desired results. Therefore, further discussion of the digital mask printing process is beyond the scope of the present disclosure.

Figure 10:
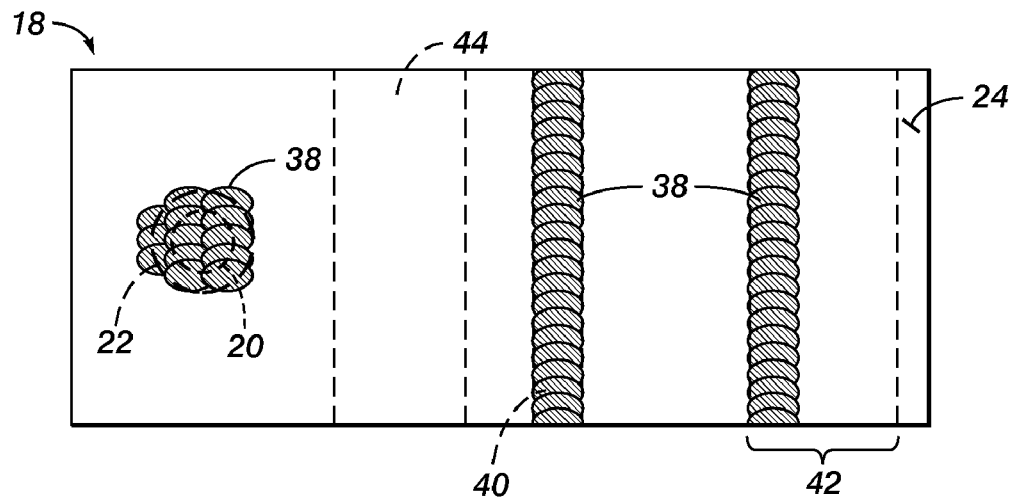
FIG. 10 is a top view of the stage of the process of forming a PCB illustrated in FIG. 9.

With reference now to FIG. 10, there is shown therein a plan view of the structure 18 having printed mask features 38 deposited onto thin film 24 to form a photomask. As illustrated, printed mask features 38 have been deposited fully over, and hence mask, trace 40, partially over trace 42, not deposited over trace 44, and importantly, fully over through hole 20 including any copper plating 22 covering the sidewalls of through hole 20. With regard to the masking of through hole 20 and sidewall 22, it will be appreciated that thin film 24 provides a surface for printed mask features 38 which is not otherwise present without thin film 24. Thus, thin film 24 facilitates masking through hole 20 and sidewall 22, solving a challenge which previously existed in the art. It will also be well understood that while hole 20 and sidewall 22 are shown in FIG. 10 to be fully covered by printed mask features 38, they may be less than fully covered (e.g., toroidally covering hole 20 and sidewall 22, exposing a portion of hole 20 and/or sidewall 22, etc.) Thus, as used herein, "substantially" covering traces, holes, and so forth shall be understood to mean fully or partially covering same.

Figure 11:
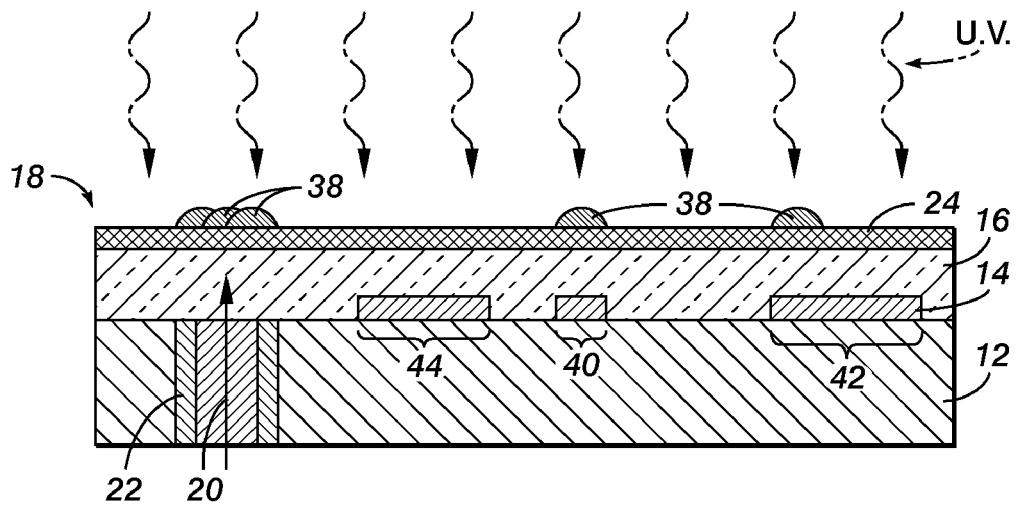
FIG. 11 is yet a further step in the process of forming a PCB according to an embodiment of the present invention, illustrating the step of exposing the masked structure to light.
Figure 12:
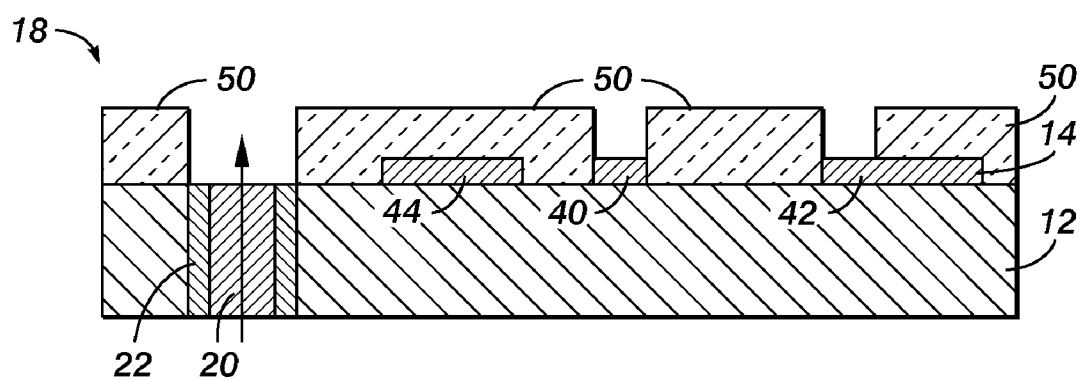
FIG. 12 is an illustration of a final stage in the process of forming a PCB according to an embodiment of the present invention, illustrating a solder mask.

With reference next to FIG. 11, structure 18 is exposed to UV radiation, exposing photoresist material 16 except where blocked by printed mask features 38 Thin film 24 may then be physically removed from structure 18, for example by simply peeling it off of the surface of exposed photoresist material 16. The hardening of photoresist material 16 due to the exposure step improves the strength of that material in resisting damage associated with the removal of thin film 24. It will be noted that in removing thin film 24, printed mask features 38 are also removed. Subsequent development removes the unexposed photoresist material 16, leaving the exposed photoresist material as an insulative, protective solder mask 50 above traces 40, 42, 44 and through hole 20 and sidewall 22. The structure at this point is shown in FIG. 12. Further processing of the PCB at this point may proceed as otherwise well known in the art.

Figure 13:
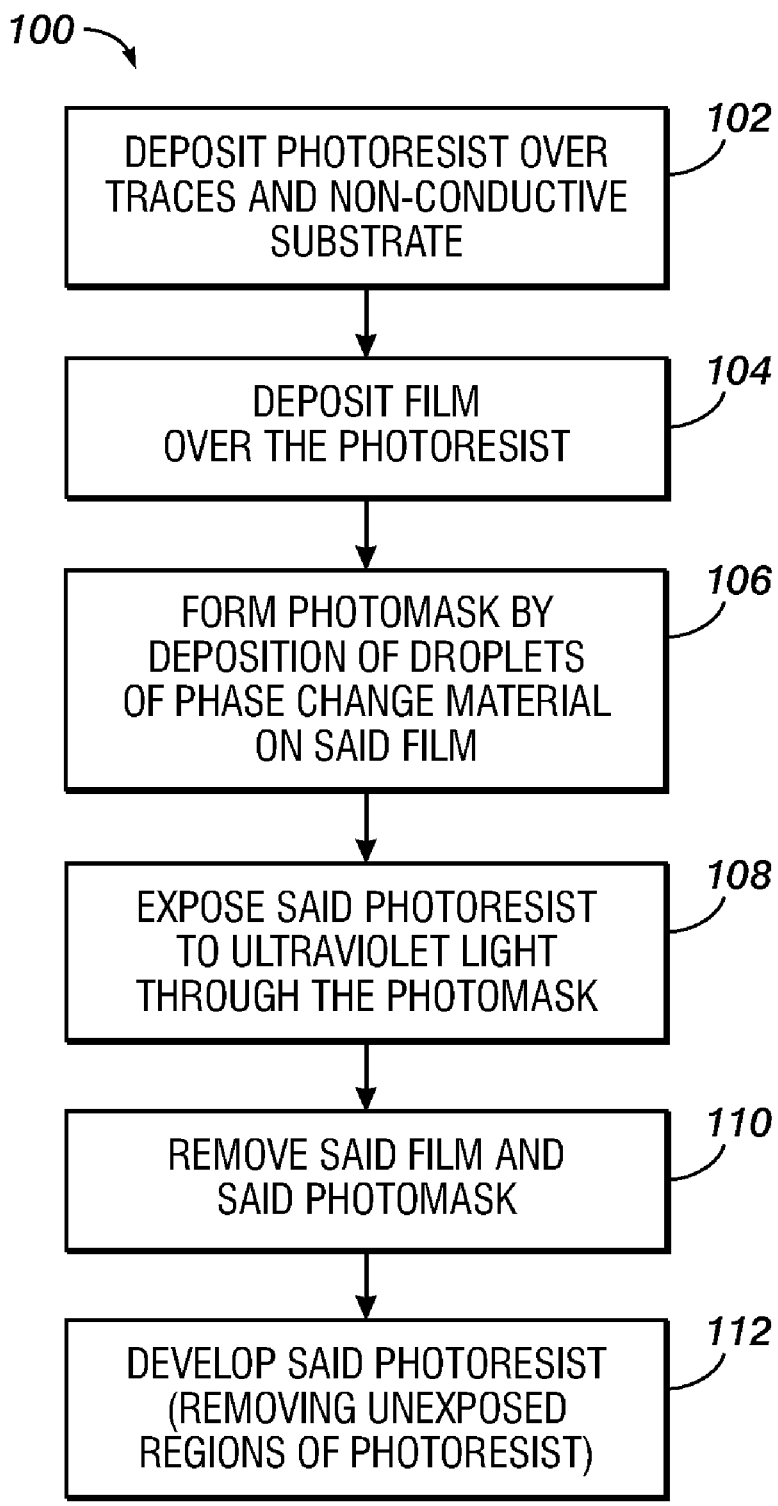
FIG. 13 is a flow chart illustrating the process of forming a PCB according to an embodiment of the present invention.

FIG. 13 illustrates the steps in a process 100 according to an embodiment of the present invention. Process 100 for forming a pattern of electrical contact regions (openings in the solder mask) over a non-conductive substrate on which electrical traces have previously been formed, comprises: forming a layer of photosensitive material over the electrical interconnections and the non-conductive substrate at step 102; depositing a film over the photosensitive material, said film transparent in a first wavelength band at step 104; depositing droplets of phase change material in a pattern on said film so as to form a photomask thereon at step 106; exposing said photosensitive material to light in said first wavelength band in regions other than directly below the photomask pattern of phase change droplets at step 108; removing said film and said photomask pattern of phase change droplets at step 110; and developing said photosensitive material so as to remove regions of said photosensitive material not exposed to said light in said first wavelength band, thereby exposing selected regions of said electrical interconnections and said non-conductive substrate at step 112. As mentioned above, further processing of the PCB at this point may proceed as otherwise well known in the art.

It will therefore be appreciated that the present invention provides a simple process for masking traces of a PCB and forming a soldermask thereover, particularly when masking over relatively large voids or through holes which were difficult or impossible to mask using prior art techniques of digital mask printing. The process of the present invention readily fits into existing manufacturing processes, and allows use of inexpensive print heads and well-understood processes for digital mask printing.

While a plurality of preferred exemplary embodiments have been presented in the foregoing detailed description, it should be understood that a vast number of variations exist, and these preferred exemplary embodiments are merely representative examples, and are not intended to limit the scope, applicability or configuration of the invention in any way. Rather, the foregoing detailed description provides those of ordinary skill in the art with a convenient guide for implementation of the invention, by way of examples, and contemplates that various changes in the functions and arrangements of the described embodiments may be made without departing from the spirit and scope of the invention defined by the claims thereto.

What is claimed is:

1. A method for forming a pattern of electrical contact regions over a non-conductive substrate on which electrical traces have previously been formed on a front side and through which at least one via has previously been formed connecting the front side of the substrate to a back side of the substrate, said via having a conductive material selectively deposited on a sidewall thereof to provide an electrical interconnection between said front side of the substrate and said back side of the substrate and further defining an open channel in a central region of the via between the conductive material formed on the sidewall of said via, comprising the steps:

forming a layer of photosensitive material over the electrical traces and the non-conductive substrate;

depositing a film over the photosensitive material, said film transparent in a first wavelength band;

depositing droplets of material opaque in said first wavelength band in a pattern on said film so as to form a photomask thereon, said photomask formed at least over said via, including said conductive material selectively deposited on a sidewall of said via and said open channel;

exposing said photosensitive material to light in said first wavelength band in regions other than directly below the photomask pattern of droplets;

removing said film and said photomask pattern of droplets;

developing said photosensitive material so as to remove regions of said photosensitive material not exposed to said light in said first wavelength band, thereby exposing selected regions of said electrical interconnections and said non-conductive substrate whereby said photosensitive material is removed over said via, exposing said conductive material selectively deposited on said sidewall of said via and leaving said channel open and unfilled.

2. The method of claim 1 wherein said droplets comprising said photomask pattern are droplets of phase change material.

3. The method of claim 1, wherein said photosensitive material is partially cured such that it presents a tacky surface, and further wherein said film adheres to said tacky surface upon application thereto.

4. The method of claim 1, wherein said photosensitive material is partially cured and further comprising the step of applying a solvent to either said photosensitive material or said film or both, such that an upper surface of said photosensitive material becomes tacky, and further wherein said film adheres to said tacky surface upon application thereto.

5. The method of claim 1, wherein said photosensitive material is partially cured and further comprising the step of applying an adhesive to either said photosensitive material or said film or both, such that said film adheres to said photosensitive material upon application thereto.

6. A pre-imaged printed circuit board with integral mask, said printed circuit board comprising:

a non-conductive substrate having a front side and a back side, said substrate having at least one via formed therein extending between and connecting said front side and said back side;

a patterned network of conductive electrical interconnections disposed over said substrate, said patterned network including an electrical interconnection between the front side of said substrate and the back side of said substrate, said electrical interconnection comprising a conductive material selectively deposited on a sidewall of said via and defining an open channel in a central region of the via between the conductive material formed on the sidewall of said via;

a layer of photosensitive material disposed over said patterned network of conductive electrical interconnections;

a photomask film disposed over said layer of photosensitive material, said photomask film transparent in a selected wavelength band; and a photomask disposed over and carried by said photomask film, said photomask comprising:

a pattern formed by a plurality of individually deposited droplets of phase-change material which is opaque in said selected wavelength band;

said photomask formed at least over said via, including said conductive material selectively deposited on a sidewall of said via and said open channel such that when developed said photosensitive material is removed over said via, exposing said conductive material selectively deposited on said sidewall of said via and leaving said channel open and unfilled between said front side and said back side.

* * * * *